US009935262B2

United States Patent
Hong et al.

(10) Patent No.: US 9,935,262 B2
(45) Date of Patent: Apr. 3, 2018

(54) MAGNETIC TUNNEL JUNCTION ELEMENT AND MANUFACTURING METHOD THEREFOR

(71) Applicant: INDUSTRY-UNIVERSITY COOPERATION FOUNDATION HANYANG UNIVERSITY, Seoul (KR)

(72) Inventors: Jinpyo Hong, Seoul (KR); Jabin Lee, Seoul (KR); Gwangguk An, Seoul (KR)

(73) Assignee: INDUSTRY-UNIVERSITY COOPERATION FOUNDATION HANYANG UNIVERSITY, Seoul (KR)

( * ) Notice: Subject to any disclaimer, the term of this patent is extended or adjusted under 35 U.S.C. 154(b) by 0 days.

(21) Appl. No.: 15/313,998

(22) PCT Filed: Apr. 29, 2015

(86) PCT No.: PCT/KR2015/004332
§ 371 (c)(1),
(2) Date: Nov. 25, 2016

(87) PCT Pub. No.: WO2015/182889
PCT Pub. Date: Dec. 3, 2015

(65) Prior Publication Data
US 2017/0213957 A1    Jul. 27, 2017

(30) Foreign Application Priority Data

May 27, 2014    (KR) .................... 10-2014-0063914

(51) Int. Cl.
*H01L 43/10* (2006.01)
*G11C 11/16* (2006.01)
(Continued)

(52) U.S. Cl.
CPC ............ *H01L 43/10* (2013.01); *G11C 11/161* (2013.01); *H01L 43/08* (2013.01); *H01L 43/12* (2013.01)

(58) Field of Classification Search
None
See application file for complete search history.

(56) References Cited

U.S. PATENT DOCUMENTS

2004/0144995 A1* 7/2004 Nagahama ............ B82Y 10/00
257/200
2008/0138660 A1* 6/2008 Parkin ................... B82Y 25/00
428/812

(Continued)

*Primary Examiner* — Bryan Junge
(74) *Attorney, Agent, or Firm* — Ladas & Parry LLP

(57) ABSTRACT

A magnetic tunnel junction device and a manufacturing method therefor are provided. The magnetic tunnel junction device comprises: a seed layer having an FCC (001) crystal structure; a first ferromagnetic layer located on the seed layer and having perpendicular magnetic anisotropy; a tunneling barrier layer located on the first ferromagnetic layer; and a second ferromagnetic layer located on the tunneling barrier layer and having perpendicular magnetic anisotropy, wherein the first ferromagnetic layer has a BCC (001) crystal structure and does not have boron. Therefore, the magnetic tunnel junction device, which is structurally and thermally more stable, can be provided by using the seed layer configured to assist the crystal growth of a boron-free magnetic layer in a BCC (001) direction and provide perpendicular magnetic anisotropy thereto, that is, $W_2N$ or TaN which is a nitrogen-doped metal material having a cubic crystal structure and having a similar lattice constant to that of a magnetic layer material.

5 Claims, 3 Drawing Sheets

(51) Int. Cl.
*H01L 43/08* (2006.01)
*H01L 43/12* (2006.01)

(56) References Cited

U.S. PATENT DOCUMENTS

| | | | |
|---|---|---|---|
| 2011/0062537 A1* | 3/2011 | Oh | B82Y 25/00 257/421 |
| 2012/0018825 A1* | 1/2012 | Lim | H01L 43/08 257/421 |
| 2016/0099407 A1* | 4/2016 | Lim | H01L 43/08 257/425 |

* cited by examiner

[FIG. 1]
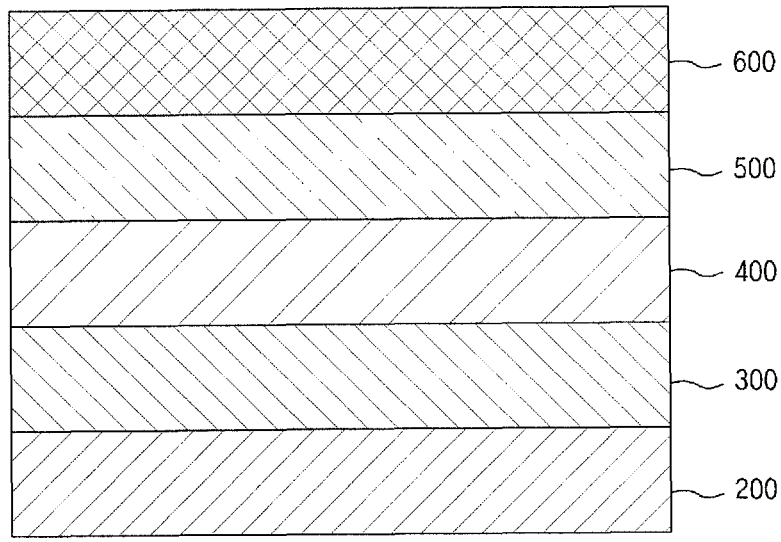
[FIG. 2]
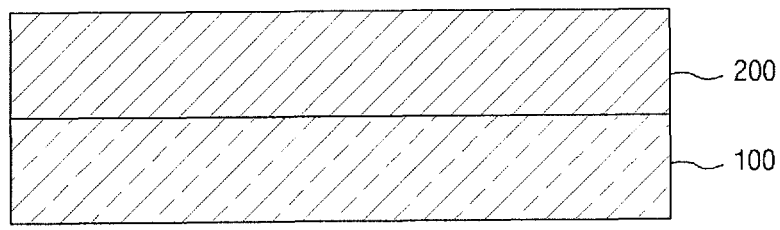
[FIG. 3]
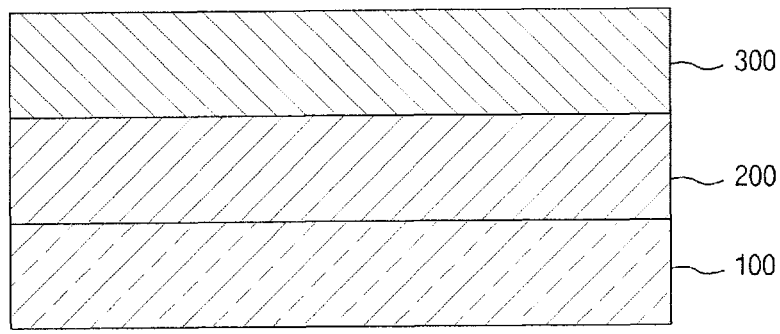

[FIG. 4]
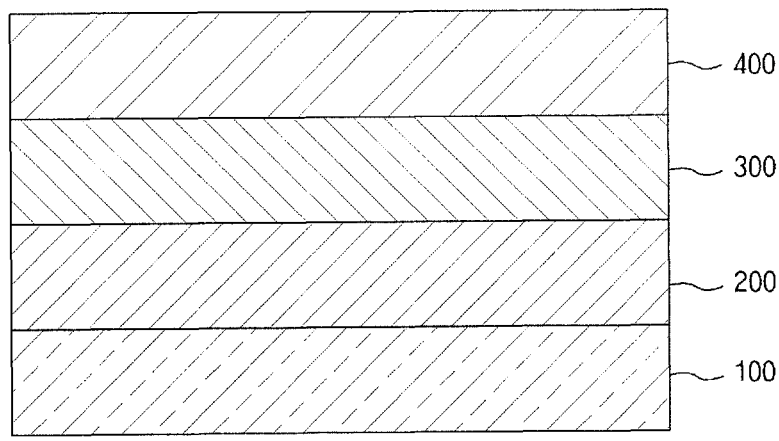
[FIG. 5]
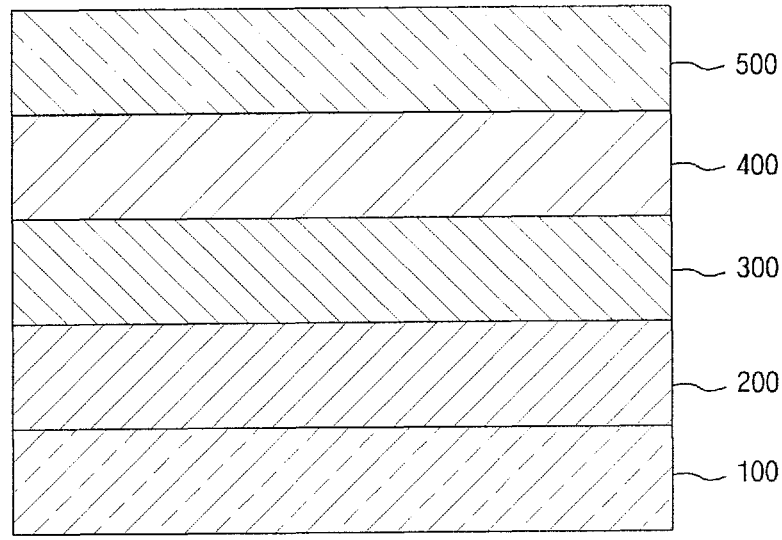

[FIG. 6]
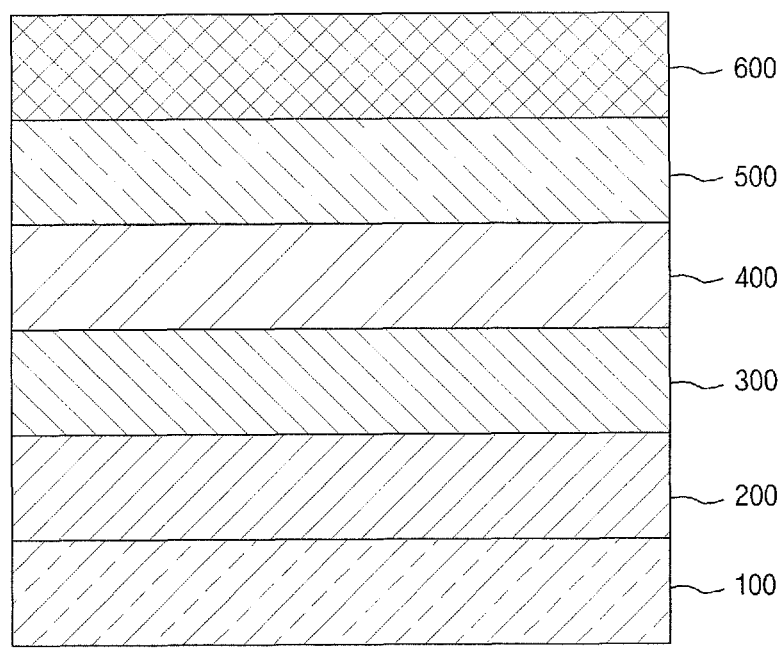

MAGNETIC TUNNEL JUNCTION ELEMENT AND MANUFACTURING METHOD THEREFOR

TECHNICAL FIELD

The present invention relates to a magnetic tunnel junction device and, more particularly, to a magnetic tunnel junction device including a boron-free seed layer for a ferromagnetic material and a manufacturing method therefor.

BACKGROUND ART

Next generation nonvolatile memories receiving attention in response to a demand for a new medium for information storage are ferromagnetic random access memory (Fe-RAM), magnetic random access memory (MRAM), resistive random access memory (ReRAM), phase-change random access memory (PRAM), etc. Each of these memories has unique advantages, and there is actively ongoing research into suitable use for each.

Of these, utilizing a quantum mechanical effect called magnetoresistance, MRAM is a large capacity nonvolatile memory with high energy efficiency, high density, and high responsiveness characteristics that can replace the currently widely used DRAM.

Giant magneto resistance (GMR) and tunneling magneto resistance (TMR) are two widely known magnetoresistance effects.

An device utilizing the GMR effect stores information by utilizing a resistance change effect of a conductive layer sandwiched between two ferromagnetic layers, with the resistance change depending on spin polarization of the ferromagnetic layers above and below. However, in a GMR device, because magnetoresistance ratio representing a rate of resistance change is low, at about 10%, information storage detection signal is small and, thus, obtaining a sufficient detection margin is the biggest challenge for realization of an MRAM device.

Meanwhile, well known device utilizing the TMR effect is a magnetic tunnel junction (MTJ) device that utilizes resistance change that depends on a magnetic tunnel junction effect.

The MTJ device has a layer structure of ferromagnetic layer/insulating layer/ferromagnetic layer. In an MTJ device, when spin directions of the layer above and below are identical, tunneling probability between the two ferromagnetic layers with an interposed insulating layer is maximized, and minimum resistance thus results. On the other hand, when spin directions of the layers above and below are opposite each other, tunneling probability is minimized, and resistance is maximized.

To realize the two spin states, magnetization direction of one of the ferromagnetic layers (a magnetic film) is fixed not to be influenced by external magnetization. A ferromagnetic layer with a fixed magnetization direction is generally called a fixed layer or a pinned layer.

Magnetization direction of the other ferromagnetic layer (a magnetic film) can be the same as or opposite the magnetization direction of the fixed layer, depending on the direction of an applied magnetic field. The ferromagnetic layer in this case is generally called a free layer and plays the role of storing information.

An MTJ device with a magnetoresistance (MR) ratio due to resistance change exceeding 50% is currently achieved and used mainly used in MRAM development.

Meanwhile, of the MTJ devices, an MTJ device utilizing a perpendicular magnetic an isotropic material is gathering attention.

In particular, research is actively ongoing for applying an MTJ device utilizing the perpendicular magnetic anisotropic material to perpendicular spin-transfer torque magnetoresistance memory (STT-MRAM), etc.

Spin-transfer torque (STT) recording refers to a method of inducing magnetization reversal by direct application of a current to a magnetic tunnel junction, rather than using an external magnetic field. The STT recording method does not require separate external wiring, thus being characteristically advantageous for high density integration.

Currently, a representative magnetic layer for an MTJ device is a layer of CoFeB material, and a structure of Ta seed layer/CoFeB magnetic layer/MgO tunneling barrier layer can provide an MTJ device with high MR, when grown with maintaining a body centered cubic (BCC) (001) crystal structure.

As a manufacturing method for the MTJ device, a method of establishing BCC (001) growth of a magnetic layer is published, in which a Ta based seed layer is deposited amorphously, after which a CoFeB magnetic layer with doped boron is again grown amorphously, MgO material is deposited on the magnetic layer in a BCC (001) crystal structure, and, after depositing all of the layers, performing a post-thermal processing thereof.

Also, it is known that BCC (001) growth of an existing amorphous CoFeB material is assisted by a portion of the boron escaping from the CoFeB material after a thermal processing.

However, when a post-thermal processing is performed, boron material escaping due to a diffusion effect combines with the MgO layer in an MTJ device to form MgBO and influences MR or causes problems with the Ta seed layer used.

Also, although, after a post-thermal processing, a portion of the Ta seed layer used in a Ta/CoFeB/MgO structure is used as a boron absorbing layer, diffusion of the layer itself occurring due to heat causes a problem in terms of lowered MR magnitude and thermal stability.

Further, because the CoFeB magnetic layer fundamentally has a large damping constant, current density Jc reduction, which is essential for device development, has a limit.

Accordingly, there is a demand for essential development of a new ferromagnetic material with a smaller damping constant for reducing current density Jc, and, for this reason, there is foremost a need for development of a seed layer material with a novel and different structure for suitably growing a new magnetic material.

DISCLOSURE OF INVENTION

Technical Problem

The present invention is directed to providing a magnetic tunneling junction device including a novel seed layer for effectively growing a boron-free ferromagnetic and perpendicular anisotropic magnetic material having a small damping constant and a manufacturing method therefor.

Technical Solution

An aspect of the present invention provides a magnetic tunnel junction device. The magnetic tunnel junction device may include a seed layer having an face centered cubic (FCC) (001) crystal structure, a first ferromagnetic layer located on the seed layer and having perpendicular magnetic anisotropy, a tunneling barrier layer located on the first ferromagnetic layer, and a second ferromagnetic layer located on the tunneling barrier layer and having perpendicular magnetic anisotropy. Here, the first ferromagnetic layer has a BCC (001) crystal structure and boron is excluded therefrom.

Also, the seed layer may include a nitrogen doped metal.

Also, the nitrogen doped metal may be $W_2N$ or TaN.

Also, the first ferromagnetic layer may include a material selected from Co, Fe, Ni, and an alloy thereof.

Also, the magnetic tunnel junction device may further include a capping layer located on the second ferromagnetic layer.

Also, the capping layer may include a nitrogen-doped metal.

Another aspect of the present invention provides a method of manufacturing a magnetic tunnel junction device. The method may include forming a seed layer having an FCC (001) crystal structure on a substrate, forming a first ferromagnetic layer having perpendicular magnetic anisotropy on the seed layer, forming a tunneling barrier layer on the first ferromagnetic layer, and forming a second ferromagnetic layer having perpendicular magnetic anisotropy on the tunneling barrier layer. Here, the first ferromagnetic layer is grown in a BCC (001) crystal structure.

Also, the forming of the first ferromagnetic layer may use a sputtering method.

Also, the seed layer may include a nitrogen-doped metal.

Also, the nitrogen-doped metal may be $W_2N$ or TaN.

Also, the first ferromagnetic layer may include a material selected from Co, Fe, Ni, and an alloy thereof.

Advantageous Effects

According to the present invention, a magnetic tunnel junction device that is structurally and thermally more stable may be provided by a seed layer configured to assist crystal growth of a boron-free magnetic layer in a BCC (001) direction and provide perpendicular magnetic anisotropy thereto.

Technical effects of the present invention are not limited by the aforementioned, and unmentioned other technical effects may clearly be understood, by a person of ordinary skill in the art, from the hereinafter description.

BRIEF DESCRIPTION OF DRAWINGS

FIG. 1 is a cross-sectional view of a magnetic tunnel junction device having perpendicular magnetic anisotropy according to an embodiment of the present invention.

FIGS. 2 to 6 are cross-sectional views, according to processing steps, of a magnetic tunnel junction device having perpendicular magnetic anisotropy according to an embodiment of the present invention.

MODE OF INVENTION

Hereinafter, embodiments of the present invention are described in detail, with references to accompanying drawings.

While the present invention allows various modifications and transformations, the specific embodiments are exemplified by the drawings and will be explained below in detail. However, there is no intent to limit the present invention to the specific form disclosed herein, and the present invention instead includes all modifications, equivalents, and alternatives included in the concepts and technical scope defined by the claims.

When it is mentioned that an device, such as a layer, an area, or a substrate, exists "on" another device, it is to be understood that the device may exist directly on the other device or that an intervening device may also exist therebetween.

Although words including "first", "second", etc. may be used to describe various devices, substances, areas, layers, and/or locations, these words are understood not to limit the devices, substances, areas, layers, and/or locations.

Also, the term "A/B/C multilayer structure" used for the present invention means a structure in which the C layer is located on the B layer which is located on the A layer, according to the indicated sequence.

A magnetic tunnel junction device having perpendicular magnetic anisotropy according to an embodiment of the present invention will be explained.

FIG. 1 is a cross-sectional view of a magnetic tunnel junction device having perpendicular magnetic anisotropy according to an embodiment of the present invention.

Referring to FIG. 1, the magnetic tunnel junction device of the present invention includes a seed layer 200, a first ferromagnetic layer 300, a tunneling barrier layer 400, and a second ferromagnetic layer 500, and a capping layer 600.

The seed layer 200 fulfills a role for effectively growing a boron-free ferromagnetic and perpendicular magnetic anisotropic material having a damping constant that is smaller than the damping constant of a CoFeB material having boron inserted therein.

Accordingly, it is preferable that the seed layer 200 is a material that assists crystal growth of a boron-free magnetic layer in a BCC (001) direction and provides perpendicular magnetic anisotropy thereto, with having a lattice constant that is similar to the lattice constant of the magnetic material that will be grown and a cubic structure.

For example, the seed layer 200 may be an FCC (001) crystal structure or a BCC (001) crystal structure, both of which are cubic crystal structures, for effectively growing a ferromagnetic layer having a BCC (001) crystal structure. Of the seed layer 200 having a BCC (001) crystal structure or an FCC (001) crystal structure, the seed layer 200 having an FCC (001) crystal structure may include a nitrogen-doped metal. Such a nitrogen-doped metal may be $W_2N$ or TaN, for example.

In particular, because $W_2N$ material has an FCC (001) crystal structure and a lattice constant that is similar to the lattice constant of an MgO material of the tunneling barrier layer 400 to be described later, BCC (001) crystal growth of a boron-free CoFe magnetic material with maintaining the existing 4-fold symmetry may be achieved.

The first ferromagnetic layer 300 is located on the seed layer 200. The first ferromagnetic layer 300 has a ferromagnetic material as the main device. The ferromagnetic material may be various material with perpendicular magnetic anisotropy and having a damping constant that is smaller than the damping constant of a CoFeB material having boron inserted therein.

The boron-free ferromagnetic material may include a material selected from Fe, Co, Ni, and an alloy thereof. For example, the first magnetic layer 300 may be a CoFe layer.

The first ferromagnetic layer 300 is a fixed layer or a free layer.

The fixed layer has a fixed magnetization direction configured not to be influenced by an external magnetic field.

The free layer fulfills a role of storing information by allowing the magnetization direction to be the same as or opposite the magnetization direction of the fixed layer, in response to an applied magnetic field direction.

The tunneling barrier layer 400 is located on the first ferromagnetic layer 300. That is, the tunneling barrier layer 400 interposes between the first ferromagnetic layer 300 and the second ferromagnetic layer 500.

Accordingly, the material for the tunneling barrier layer 400 can be any material that is an insulating material. For example, the insulating material may be at least one selected from the group consisting of MgO, $Al_2O_3$, $HfO_2$, $TiO_2$, $Y_2O_3$, and $Yb_2O_3$. The tunneling barrier layer 400 may preferably be an MgO layer.

Further, for having a high magnetoresistance (MR) ratio, the tunneling barrier layer 400 should preferably also be a BCC (001) crystal structure. For example, the tunneling barrier layer 400 is an MgO layer having a BCC (001) crystal structure.

The second ferromagnetic layer 500 is located on the tunneling barrier layer 400. If the first ferromagnetic layer 300 is a fixed layer, then the second ferromagnetic layer 500 is a free layer, and, if the first ferromagnetic layer 300 is a free layer, then the second ferromagnetic layer 500 is a fixed layer.

In this case, the second ferromagnetic layer 500 has a ferromagnetic material having perpendicular magnetic anisotropy as the main element. Accordingly, for having perpendicular magnetic anisotropy, the second ferromagnetic layer 500 may include at least one selected from the group consisting of Fe, Co, Ni, B, Si, Zr, Pt, Tb, Pd, Cu, W, Ta, and an alloy thereof.

Meanwhile, the second ferromagnetic layer 500 may also be a ferromagnetic layer having a BCC (001) crystal structure, as necessary. If the second ferromagnetic layer 500 has a BCC structure, there is an advantage of being able to select a material having cubic crystal structure as the capping layer 600.

The capping layer 600 is located on the second ferromagnetic layer 500. The capping layer 600 functions as a protective layer and protects the second ferromagnetic layer 500 from being oxidized. For example, the capping layer 600 may include W, Hf, Pd, or Pt.

Meanwhile, a material having a cubic structure may be selected for the capping layer 600. The reason is that because the seed layer 200, the first ferromagnetic layer 300, the tunneling barrier layer 400, and the second ferromagnetic layer 500 may be sequentially grown in a BCC (001) crystal structure in this order, a capping layer 600 in a cubic structure can be grown on the second ferromagnetic layer 500 that is grown in a BCC (001) crystal structure.

Accordingly, the capping layer 600 with a cubic structure has an FCC (001) crystal structure and may include a nitrogen-doped metal as a material that can prevent the second ferromagnetic layer from being oxidized. For example, the nitrogen-doped metal may be $W_2N$ or TaN.

A method of manufacturing a magnetic tunneling junction device having perpendicular magnetic anisotropy according to an embodiment of the present invention be explained.

FIGS. 2 to 6 are cross-sectional views, according to processing steps, of a magnetic tunnel junction device having perpendicular magnetic anisotropy according to an embodiment of the present invention.

Referring to FIG. 2, a seed layer 200 having an FCC (001) crystal structure is formed on a substrate 100. Here, the seed layer 200 may include a nitrogen-doped metal. For example, the nitrogen-doped metal may be $W_2N$ or TaN.

The seed layer 200 may be formed by a sputtering method. For example, a $W_2N$ seed layer may be grown in an FCC (001) crystal structure on the substrate 100 using reactive sputtering.

Referring to FIG. 3, a first ferromagnetic layer 300 is formed on the seed layer 200. The first ferromagnetic layer 300 may include a material selected from Co, Fe, Ni, and an alloy thereof.

Here, the first ferromagnetic layer 300 is grown in a BCC (001) crystal structure. The first ferromagnetic layer 300 may be grown in a BCC (001) crystal structure using a sputtering method. For example, using reactive sputtering, a CoFe ferromagnetic layer may be grown in a BCC (001) crystal structure on a $W_2N$ seed layer 200 having an FCC (001) crystal structure.

Referring to FIG. 4, a tunneling barrier layer 400 is formed on the first ferromagnetic layer 300. The tunneling barrier layer 400 may be at least one selected from the group consisting of MgO, $Al_2O_3$, $HfO_2$, $TiO_2$, $Y_2O_3$, and $Yb_2O_3$. The tunneling barrier layer 400 may preferably be an MgO layer.

Here, the tunneling barrier layer 400 is grown in a BCC (001) crystal structure. The tunneling barrier layer 400 may be grown in a BCC (001) crystal structure using a sputtering method. For example, an MgO tunneling barrier layer may be grown in a BCC (001) crystal structure on a CoFe ferromagnetic layer using reactive sputtering.

Referring to FIG. 5, a second ferromagnetic layer 500 having perpendicular magnetic anisotropy is formed on the tunneling battier layer 400. For having perpendicular magnetic anisotropy, the second ferromagnetic layer 500 may include at least one selected from the group consisting of Fe, Co, Ni, B, Si, Zr, Pt, Tb, Pd, Cu, W, Ta, and an alloy thereof.

The second ferromagnetic layer 500 may be formed through a conventional deposition method. For example, a physical vapor deposition method, a chemical vapor deposition method, a sputtering method, or a solution processing method may be used.

Meanwhile, the second ferromagnetic layer 500 may also be grown in a BCC (001) crystal structure. In this case, the second ferromagnetic layer 500 may be grown using a sputtering method. For example, using reactive sputtering, the second ferromagnetic layer 500 may be grown in a BCC (001) crystal structure on an MgO layer having a BCC (001) crystal structure.

Referring to FIG. 6, a capping layer 600 is formed on the second ferromagnetic layer 500. For example, the capping layer 500 may include Ta, W, Hf, Pd, or Pt.

The capping layer 600 may be formed using a conventional deposition method. For example, a physical vapor deposition method, a chemical vapor deposition method, a sputtering method, or a solution processing method may be used.

Meanwhile, when the second ferromagnetic layer is grown in a BCC (001) crystal structure, the capping layer can be grown into a layer having a cubic structure using a sputtering method. For example, on a CoFe magnetic layer having a BCC (001) crystal structure, a $W_2N$ layer can be grown in an FCC (001) crystal structure. In this case, as the capping layer 600 material, a nitrogen-doped metal may be selected as a material that has an FCC (001) crystal structure and can protect the second ferromagnetic layer from being oxidizing. The nitrogen-doped metal may be, for example, $W_2N$ or TaN.

According to the present invention, using a seed layer that assists growth of a boron-free magnetic layer in a BCC (001) direction and provides perpendicular magnetic anisotropy thereto, that is, using $W_2N$ or TaN which is a nitrogen-doped metal material having a cubic crystal structure and a lattice constant that is similar to the lattice constant of a magnetic layer material, structurally and thermally more stable magnetic tunnel junction device may be provided.

Meanwhile, embodiments of the present invention shown in the present disclosure and drawings are for enhancing understanding and are not intended to limit the scope of the present invention. It is clear to a person with ordinary knowledge in the art to which the present invention belongs that other modified embodiments based on the technical concepts of the present invention are possible, besides the disclosed embodiments.

The invention claimed is:

1. A magnetic tunnel junction device, comprising:
   a seed layer having an FCC (001) crystal structure;
   a first ferromagnetic layer located on the seed layer and having perpendicular magnetic anisotropy;
   a tunneling barrier layer located on the first ferromagnetic layer; and
   a second ferromagnetic layer located on the tunneling barrier layer and having perpendicular magnetic anisotropy, wherein
   the seed layer is $W_2N$, and
   the first ferromagnetic layer has CoFe having a BCC (001) crystal structure and does not have boron.

2. The magnetic tunnel junction device of claim 1, further comprising a capping layer located on the second ferromagnetic layer.

3. The magnetic tunnel junction device of claim 2, wherein the capping layer comprises a nitrogen doped metal.

4. A method of manufacturing a magnetic tunnel junction device, comprising:
   forming a seed layer of W2N having an FCC (001) crystal structure on a substrate;
   forming a first ferromagnetic layer of CoFe having perpendicular magnetic anisotropy on the seed layer;
   forming a tunneling barrier layer on the first ferromagnetic layer; and
   forming a second ferromagnetic layer having perpendicular magnetic anisotropy on the tunneling barrier layer, wherein
   the first ferromagnetic layer is grown in a BCC (001) crystal structure.

5. The method of manufacturing a magnetic tunnel junction device of claim 4, wherein the forming of the first ferromagnetic layer uses a sputtering method.

* * * * *